(12) United States Patent
Liu et al.

(10) Patent No.: US 8,059,249 B2
(45) Date of Patent: Nov. 15, 2011

(54) FLAT PANEL DISPLAY AND CHIP BONDING PAD

(75) Inventors: Chun-Hsin Liu, Hsinchu (TW); Po-Yuan Liu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 497 days.

(21) Appl. No.: 12/176,416

(22) Filed: Jul. 21, 2008

(65) Prior Publication Data

US 2009/0284909 A1  Nov. 19, 2009

(30) Foreign Application Priority Data

May 16, 2008 (TW) ................................ 97118214 A (51) Int. Cl.
*G02F 1/1345* (2006.01)
(52) U.S. Cl. ......... 349/150; 349/151; 349/152; 349/149
(58) Field of Classification Search ........... 349/149–152
See application file for complete search history.

(56) References Cited

U.S. PATENT DOCUMENTS

| | | | |
|---|---|---|---|
| 6,697,040 B2 | 2/2004 | Imajo et al. | |
| 6,879,367 B2 * | 4/2005 | Ukita | 349/149 |
| 7,053,407 B2 | 5/2006 | Ma et al. | |
| 7,116,391 B2 | 10/2006 | Kim | |
| 7,221,424 B2 | 5/2007 | Ahn | |
| 7,292,289 B2 * | 11/2007 | Nagahama | 349/58 |
| 2002/0122149 A1 | 9/2002 | Choo et al. | |
| 2003/0043100 A1 * | 3/2003 | Moon | 345/87 |
| 2006/0049407 A1 | 3/2006 | Jung et al. | |
| 2006/0232579 A1 * | 10/2006 | Chen et al. | 345/211 |
| 2007/0206146 A1 | 9/2007 | Wang | |

FOREIGN PATENT DOCUMENTS

CN  1959478  5/2007

OTHER PUBLICATIONS

"1st Office Action of China counterpart application", issued on Jul. 3, 2009, p. 1-p. 5.

* cited by examiner

*Primary Examiner* — Wen-Ying P Chen
(74) *Attorney, Agent, or Firm* — Jianq Chyun IP Office (57) ABSTRACT

A flat panel display and a chip bonding pad thereof are provided. The flat panel display includes a display panel, an FPC board, first and second source driving chips, and a control circuit board. First and second wires in a peripheral circuit region of the display panel extend from the underneath of the FPC board to two opposite sides of the display panel and electrically connect the FPC board. The first source driving chips electrically connect the FPC board through parts of the first wires. The second source driving chips electrically connect the FPC board through the second wires. The chip bonding pad is under one of the first and second source driving chips. The chip bonding pad includes a first dielectric layer having first through holes and a second dielectric layer having second and third through holes arranged alternately. The second through holes correspond to the first through holes.

18 Claims, 7 Drawing Sheets

FLAT PANEL DISPLAY AND CHIP BONDING PAD

CROSS-REFERENCE TO RELATED APPLICATION

This application claims the priority benefit of Taiwan application serial no. 97118214, filed on May 16, 2008. The entirety of the above-mentioned patent application is hereby incorporated by reference herein and made a part of this specification.

BACKGROUND OF THE INVENTION

1. Field of the Invention

The present invention is related to a flat panel display and a chip bonding pad. More particularly, the present invention is related to a flat panel display in which signal transmission impedances are matched and a chip bonding pad characterized by low impedance of signal transmission.

2. Description of Related Art

With an advancement of information industries, volume requirements for various displays result in miniaturization of the displays in the market. For instance, conventional cathode ray tube (CRT) displays have been replaced by flat panel displays including liquid crystal displays (LCDs), organic light emitting displays (OLEDs), and so on.

Figure 1A:
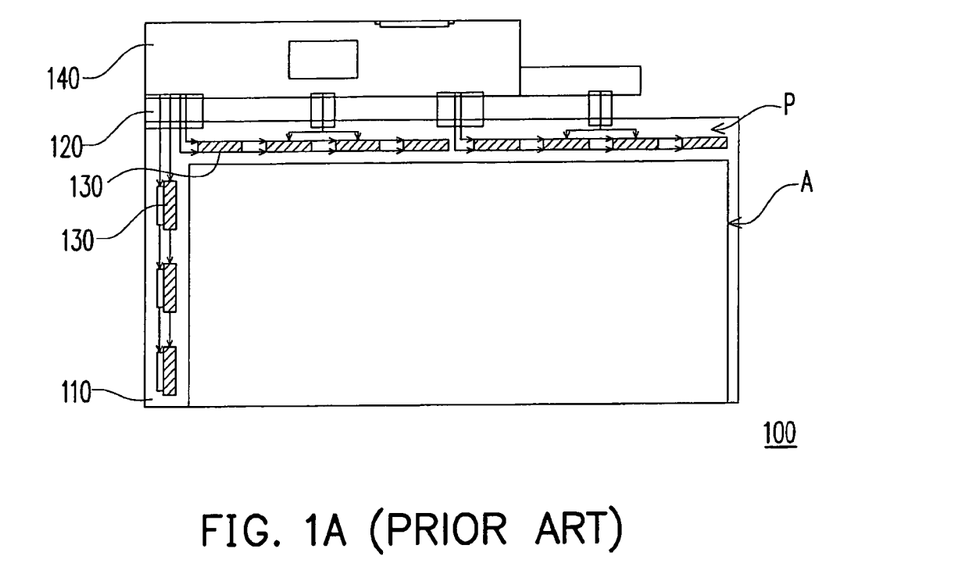
FIG. 1A is a schematic view of a conventional flat panel display.

FIG. 1A is a schematic view of a conventional flat panel display. Referring to FIG. 1A, a flat panel display 100 includes a display panel 110, a plurality of flexible printed circuit (FPC) boards 120, a plurality of driving chips 130, and a control circuit board 140. The display panel 110 includes a display region A and a peripheral circuit region P. The driving chips 130 are disposed within the peripheral circuit region P. Besides, the driving chips 130 are electrically connected to the control circuit board 140 through the corresponding FPC boards 120.

Due to the increased dimension and resolution of the display panel 110, the number of the required driving chips 130 is increased accordingly. In order to enable all of the driving chips 130 to receive ground signals, power source signals, or other signals at a substantially equivalent level, an increase in the number of the FPC boards 120 is usually necessitated. Meanwhile, the length of the control circuit board 140 needs to be extended, such that all of the FPC boards 120 can be connected to the control circuit board 140. As such, material costs of the flat panel display 100 are raised because of the increased number of the FPC boards 120 and the increased area occupied by the control circuit board 140.

Figure 1B:
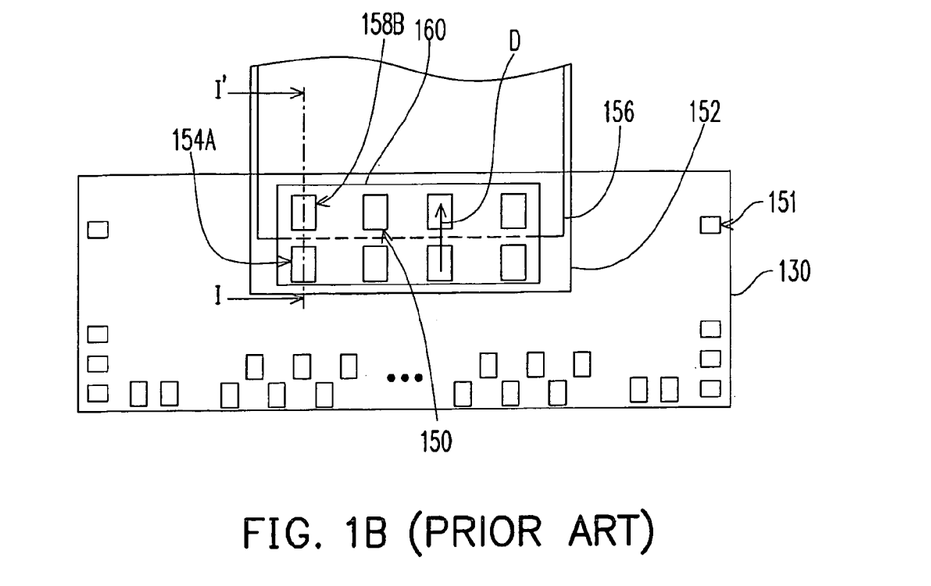
FIG. 1B is a partial top view illustrating a location where the driving chips are disposed on the display panel depicted in FIG. 1A.
Figure 1C:
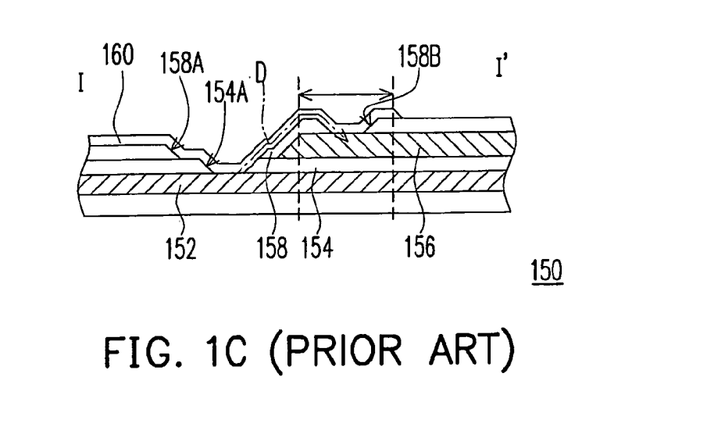
FIG. 1C is a cross-sectional view taken along a sectional line I-I' of FIG. 1B.

FIG. 1B is a partial top view illustrating a location where the driving chips are disposed on the display panel depicted in FIG. 1A. FIG. 1C is a cross-sectional view taken along a sectional line I-I' of FIG. 1B. Referring to FIGS. 1A and 1B, the display panel 100 also includes a plurality of chip bonding pads 150 and 151 for connecting the driving chips 130. When the driving chips 130 are disposed on the display panel 110, the chip bonding pad 150 is then covered by the driving chips 130.

Next, as shown in FIGS. 1B and 1C, the chip bonding pad 150 includes a first conductive layer 152, a first dielectric layer 154, a second conductive layer 156, a second dielectric layer 158, and a third conductive layer 160 that are sequentially stacked. The first dielectric layer 154 has a plurality of first through holes 154A. The second dielectric layer 158 has a plurality of second through holes 158A and a plurality of third through holes 158B. The second through holes 158A correspond to the first through holes 154A for exposing a portion of the first conductive layer 152, while the third through holes 158B expose a portion of the second conductive layer 156. Besides, the third conductive layer 160 covers the second dielectric layer 158, the portion of the first conductive layer 152 exposed by the first through holes 154A, and the portion of the second conductive layer 156 exposed by the third through holes 158B.

The first through holes 154A and the third through holes 158B are juxtaposed in pairs. Thereby, signal transmission paths between the conductive layers in the chip bonding pad 150 merely have a single direction or path. For instance, when a signal is transmitted from the first conductive layer 152 to the second conductive layer 156, the signal is transmitted along a direction D. The third conductive layer 160 is often made of a transparent conductive material including an indium tin oxide. Hence, the third conductive layer 160 has a relatively great transmission impedance.

SUMMARY OF THE INVENTION

The present invention is directed to a flat panel display capable of removing a material cost barrier of an FPC board and a control circuit board in a conventional flat panel display.

The present invention is further directed to a chip bonding pad capable of decreasing a relatively high transmission impedance of a conventional chip bonding pad.

The present invention provides a flat panel display including a display panel, an FPC board, a plurality of gate driving chips, a plurality of first source driving chips, a plurality of second source driving chips, and a control circuit board. The control circuit board is electrically connected to the FPC board. The display panel includes a display region and a peripheral circuit region. Besides, the display panel has a plurality of first wires and second wires disposed within the peripheral circuit region. Some of the first wires or some of the second wires are circuitous traces. Namely, part of the first wires or part of the second wires is a circuitous trace. The FPC board is electrically connected to the first wires and the second wires. Here, the first wires and the second wires respectively extend from the underneath of the FPC board to two opposite sides of the display panel. The gate driving chips are disposed in the peripheral circuit region and electrically connected to a part of the first wires. The first source driving chips are disposed in the peripheral circuit region and electrically connected to the FPC board through the other part of the first wires. The second source driving chips are disposed in the peripheral circuit region and electrically connected to the FPC board through the second wires.

In an embodiment of the present invention, the FPC board includes a first sub-FPC board and a second sub-FPC board. The first sub-FPC board is electrically connected to the first source driving chips through the first wires, while the second sub-FPC board is electrically connected to the second source driving chips through the second wires.

In an embodiment of the present invention, the number of the first source driving chips is equal to the number of the second source driving chips.

In an embodiment of the present invention, the number of the first source driving chips is different from the number of the second source driving chips.

In an embodiment of the present invention, at least two of the first wires or at least two of the second wires are electrically insulated from each other.

In an embodiment of the present invention, the first wires are power source signal transmission lines or ground signal transmission lines.

In an embodiment of the present invention, the first wires have a structure in which multiple conductive lines are disposed.

In an embodiment of the present invention, the second wires are power source signal transmission lines or ground signal transmission lines.

In an embodiment of the present invention, the second wires have a structure in which multiple conductive lines are disposed.

In an embodiment of the present invention, each of the first wires or each of the second wires has a chip bonding pad disposed under one of the first source driving chips or the second source driving chips. The chip bonding pad includes a first conductive layer, a first dielectric layer, a second conductive layer, a second dielectric layer, and a third conductive layer. The first dielectric layer covers the first conductive layer and has a plurality of first through holes. The second conductive layer is disposed on the first dielectric layer. The second dielectric layer covers the second conductive layer and the first dielectric layer. In addition, the second dielectric layer has a plurality of second through holes and third through holes arranged alternately. The second through holes correspond to the first through holes, and the distances between each of the first through holes and the two adjacent third through holes are substantially the same. Moreover, the third conductive layer covers the second dielectric layer, the second conductive layer exposed by the third through holes, and the first conductive layer exposed by the first through holes. The first conductive layer is electrically connected to the second conductive layer through the third conductive layer.

In an embodiment of the present invention, the first through holes and the third through holes of the chip bonding pad are alternately arranged along a width direction of the first wires or the second wires. The second conductive layer has a plurality of protrusions that are partially exposed by the third through holes, for example, and each of the second through holes is interposed between the two adjacent protrusions, respectively. A material of the first conductive layer and the second conductive layer includes metal, while a material of the third conductive layer includes a transparent conductive material.

In an embodiment of the present invention, the display panel further includes a plurality of third wires and fourth wires disposed within the peripheral circuit region. Each of the third wires is electrically connected between the two adjacent first source driving chips, while each of the fourth wires is electrically connected between the two adjacent second source driving chips.

The present invention further provides a chip bonding pad including a first conductive layer, a first dielectric layer, a second conductive layer, a second dielectric layer, and a third conductive layer. The first dielectric layer covers the first conductive layer and has a plurality of first through holes. The second conductive layer is disposed on the first dielectric layer. The second dielectric layer covers the second conductive layer and the first dielectric layer. In addition, the second dielectric layer has a plurality of second through holes and third through holes arranged alternately. The second through holes correspond to the first through holes, and the distances between each of the first through holes and the two adjacent third through holes are substantially the same. Moreover, the third conductive layer covers the second dielectric layer, the second conductive layer exposed by the third through holes, and the first conductive layer exposed by the first through holes. The first conductive layer is electrically connected to the second conductive layer through the third conductive layer.

In an embodiment of the present invention, the first through holes and the third through holes are alternately arranged along a predetermined direction.

In an embodiment of the present invention, the second conductive layer has a plurality of protrusions that are partially exposed by the third through holes, and each of the second through holes is interposed between the two adjacent protrusions, respectively.

In an embodiment of the present invention, a material of the first conductive layer and the second conductive layer includes metal, while a material of the third conductive layer includes a transparent conductive material.

The circuitous traces acting as the wires and disposed between the FPC board and the driving chips are employed in the flat panel display of the present invention. Thereby, the transmission impedance of each wire can be individually adjusted, such that the transmission impedances of all of the wires can be matched. Therefore, only a few FPC boards are required in the flat panel display of the present invention, so as to allow each of the driving chips to receive the power source signals, the ground signals, or other signals at the same level. In addition, the conductive layers in the chip bonding pad of the present invention are connected in parallel, such that the transmission impedance and the area occupied by the chip bonding pad can be reduced.

To make the above and other objectives, features, and advantages of the present invention more comprehensible, several embodiments accompanied with figures are detailed as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 2A:
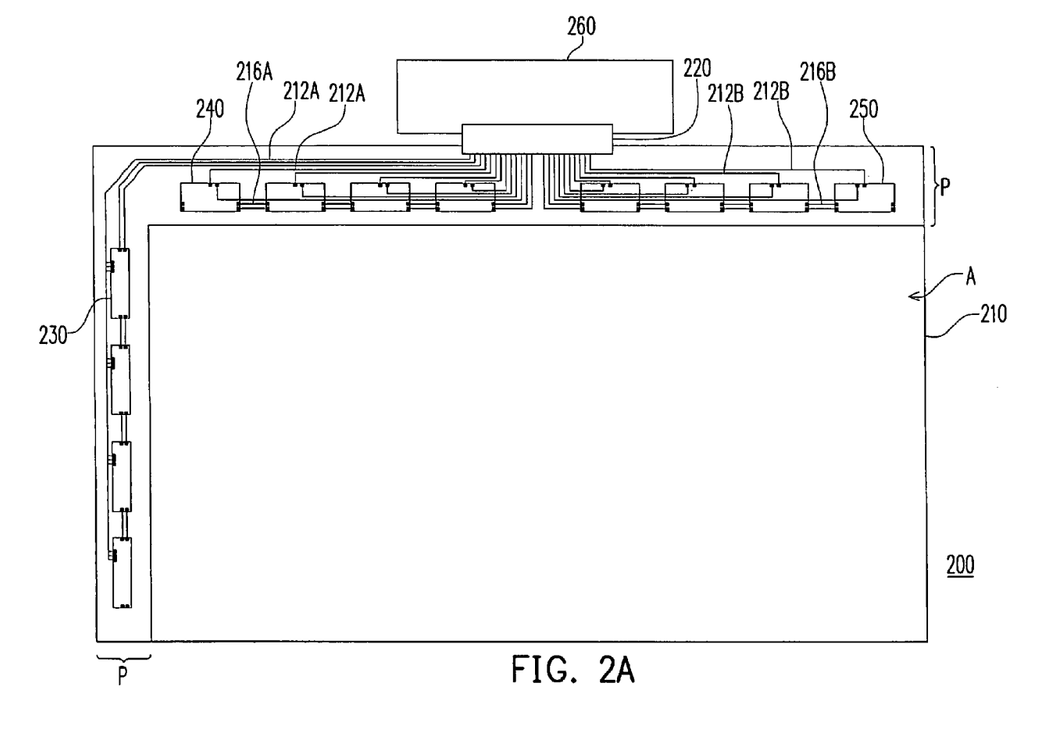
FIG. 2A is an LCD according to an embodiment of the present invention.

FIG. 2A is an LCD according to an embodiment of the present invention. Referring to FIG. 2A, a flat panel display 200 includes a display panel 210, an FPC board 220, a plurality of gate driving chips 230, a plurality of first source driving chips 240, a plurality of second source driving chips 250, and a control circuit board 260. The control circuit board 260 is electrically connected to the FPC board 220. The display panel 210 includes a display region A and a peripheral circuit region P. The gate driving chips 230, the first source driving chips 240, and the second source driving chips 250 are all disposed within the peripheral circuit region P.

The display panel 210 has a plurality of first wires 212A and second wires 212B disposed within the peripheral circuit region P. The FPC board 220 is electrically connected to the first wires 212A and the second wires 212B. Here, the first wires 212A and the second wires 212B respectively extend from the underneath of the FPC board 220 to two opposite sides of the display panel 210. The gate driving chips 230 is electrically connected to a part of the first wires 212A. The first source driving chips 240 are electrically connected to the FPC board 220 through the other part of the first wires 212A. The second source driving chips 250 are electrically connected to the FPC board 220 through the second wires 212B.

The display panel 210 further includes a plurality of third wires 216A and fourth wires 216B disposed within the peripheral circuit region P. Each of the third wires 216A is electrically connected between the two adjacent first source driving chips 240, while each of the fourth wires 216B is electrically connected between the two adjacent second source driving chips 250, respectively.

The FPC board 220 of the present embodiment is preferably interposed between the first source driving chips 240 and the second source driving chips 250, which is not limited in the present invention. In the meantime, the first wires 212A and the second wires 212B respectively connected to the first source driving chips 240, and the second source driving chips 250 are concentrated or centralized in the present embodiment. As such, it is not necessary to increase the length of the control circuit board 260 of the present embodiment for the purpose of connecting the FPC board 220. In other words, material costs required by the control circuit board 260 and an area occupied by the control circuit board 260 can be reduced according to the present embodiment, and so can the required number and the necessary material costs of the FPC board 220 be reduced.

Preferably, as the display panel 210 performs a display function, the first source driving chips 240 and the second source driving chips 250 receive power source signals, ground signals, or other signals at a substantially equivalent level for ensuring frame quality, which is not limited in the present invention. Therefore, the power source signals, the ground signals, or other signals issued by drivers on the control circuit board 260 must be transmitted through each of the first wires 212A and the second wires 212B on the same condition. Moreover, an influence caused by a varied signal decay must be precluded. Namely, when the first wires 212A are power source signal transmission lines or ground signal transmission lines, different signal transmission paths of the first wires 212A preferably have similar or substantially equivalent transmission impedance, which is not limited in the present invention. Likewise, when the second wires 212B are the power source signal transmission lines or the ground signal transmission lines, the different signal transmission paths of the second wires 212B preferably have the similar or substantially equivalent transmission impedance, which is not limited in the present invention. Please refer to FIG. 2B and relevant descriptions regarding the way to allow different first wires 212A or different second wires 212B to have the similar or substantially equivalent transmission impedance.

Figure 2B:
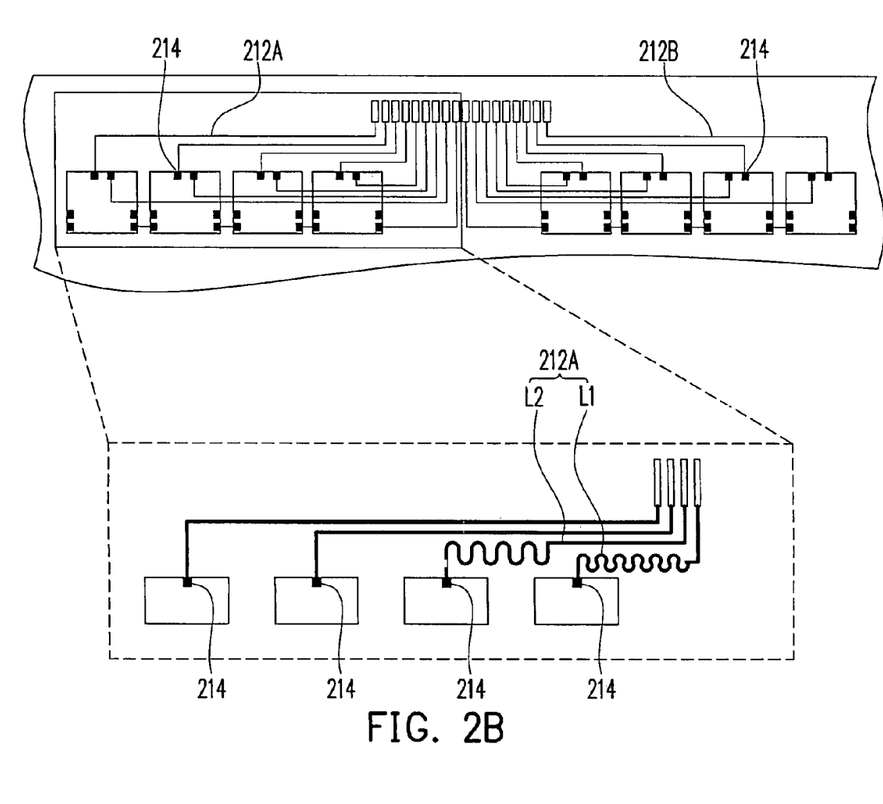
FIG. 2B is a partial enlarged view of a peripheral circuit region of the display panel depicted in FIG. 2A.

FIG. 2B is a partial enlarged view of a peripheral circuit region of the display panel depicted in FIG. 2A. In the peripheral circuit region P of the display panel 210, some of the first wires 212A or some of the second wires 212B are circuitous traces, such as two of the first wires 212 respectively marked as L1 and L2. However, it is not limited in the present invention. Through said design, the signal transmission impedance of each of the first wires 212A can be compensated.

Besides, a plurality of chip bonding pads 214 are disposed on the display panel 210 for bonding the driving chips 230, 240, or 250. The first wires 212A are connected to the chip bonding pads 214, respectively. In practice, one end of each of the first wires 212A is connected to the chip bonding pads 240, while the other end of each of the first wires 212A is connected to the underneath of the FPC board 220. Although the distances between the FPC board 220 and the chip bonding pads 214 respectively connected to each of the first wires 212A and each of the second wires 212B are different, the signal transmission paths of each of the first wires 212A and each of the second wires 212B can have the similar or substantially equivalent transmission impedance because of the design of the circuitous traces.

As such, even though the power source signals, the ground signals, or other signals issued by the drivers on the control circuit board 260 are decayed during the signal transmission, it is also likely for each of the first source driving chips 240 and each of the second source driving chips 250 to receive the signals at a substantially equivalent level. Preferably, some of the first wires 212A or some of the second wires 212B are designed as the circuitous traces according to the present embodiment and, therefore, the transmission impedances of each of the first wires 212A and each of the second wires 212B can be individually adjusted and matched. However, it is not limited in the present invention. By means of said design, yield of the wires can be improved without re-adjusting the line widths of the first wires 212A and the second wires 212B.

In an alternative, during the fabrication of the first wires 212A and the second wires 212B, it is preferably to adjust the line widths of the wires based on the lengths of the wires, such that the transmission impedances of the first wires 212A and the second wires 212B can be matched, which is not limited in the present invention. Nevertheless, on condition that the aforesaid design is applied, some of the first wires 212A or some of the second wires 212B which are longer than the other first wires 212A or the other second wires 212B may have a relatively short or narrow line width.

In the present embodiment, preferably, the number of the first source driving chips 240 can be equal to the number of the second source driving chips 250. For example, the number of the first source driving chips 240 is four, and so is the number of the second source driving chips 250. However, it is not limited in the present invention. On the other hand, the display panel 210 depicted in FIG. 2A may be the flat panel display panels, such as an LCD panel, a plasma display panel, an organic electro-luminescent display panel, and so on, which is not limited in the present invention. In a preferred embodiment, since the display panel 210 has various elements composed of multiple conductive layers, such as thin film transistors, gate lines, or data lines, the first wires 212A and the second wires 212B can be formed by using the conductive layers. However, it is not limited in the present invention. That is to say, the first wires 212A and the second wires 212B can have a structure in which multiple conductive lines are disposed. Besides, the first wires 212A, the second wires 212B, and other elements disposed within the display panel 210 can be made of the same material. Moreover, when the first wires 212A and the second wires 212B have the structure in which multiple conductive lines are disposed, a cross-section area of the signal transmission can be increased, so as to lower the signal transmission impedance.

In a preferred embodiment, at least two of the first wires 212A or at least two of the second wires 212B are electrically insulated from each other, which is not limited in the present invention. When one or more first wires 212A and one or more second wires 212B transmit the same signals with different signal transmission impedances, it is likely to correspondingly adjust strength of the same signals transmitted by the first wires 212A and the second wires 212B through the drivers on the control circuit board 260. Thereby, the first source driving chips 240 and the second source driving chips 250 are able to receive the signals at the substantially equivalent level. When two or more first wires 212A transmit the same signals with different signal transmission impedances, it is likely to correspondingly adjust the strength of the signals transmitted by the first wires 212A through the drivers on the control circuit board 260. Thereby, the first source driving chips 240 are able to receive the signals at the substantially equivalent level. Likewise, when two or more second wires 212B transmit the same signals with different signal transmission impedances, it is likely to correspondingly adjust the strength of the signals transmitted by the second wires 212B through the drivers on the control circuit board 260. Thereby, the different second source driving chips 250 are able to receive the signals at the substantially equivalent level. In other words, at least two of the first wires 212A or at least two of the second wires 212B are electrically insulated from each other according to the present invention. As such, the transmitted signals can be adjusted individually, so as to allow the flat panel display 200 to have outstanding display quality.

Figure 3A:
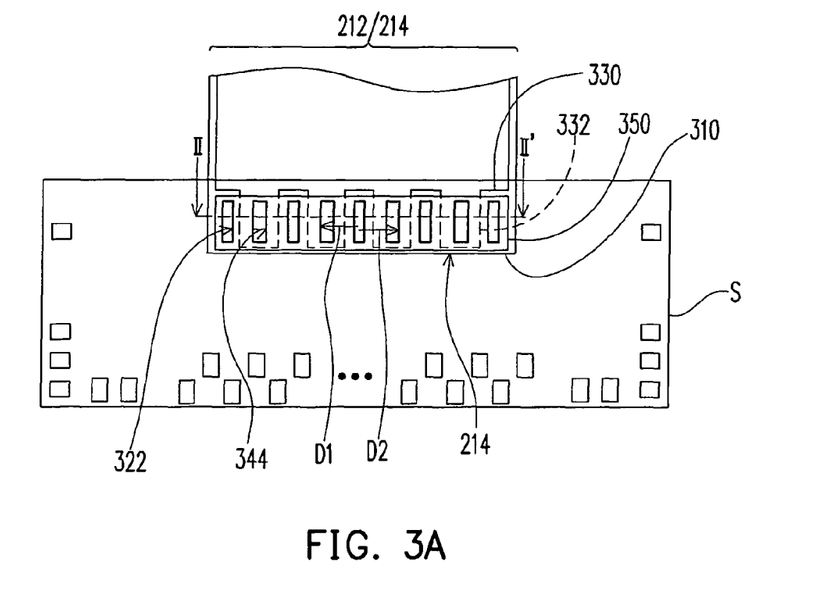
FIG. 3A is a schematic partial enlarged view illustrating a location where chip bonding pads and a driving chip are disposed according to an embodiment of the present invention.
Figure 3B:
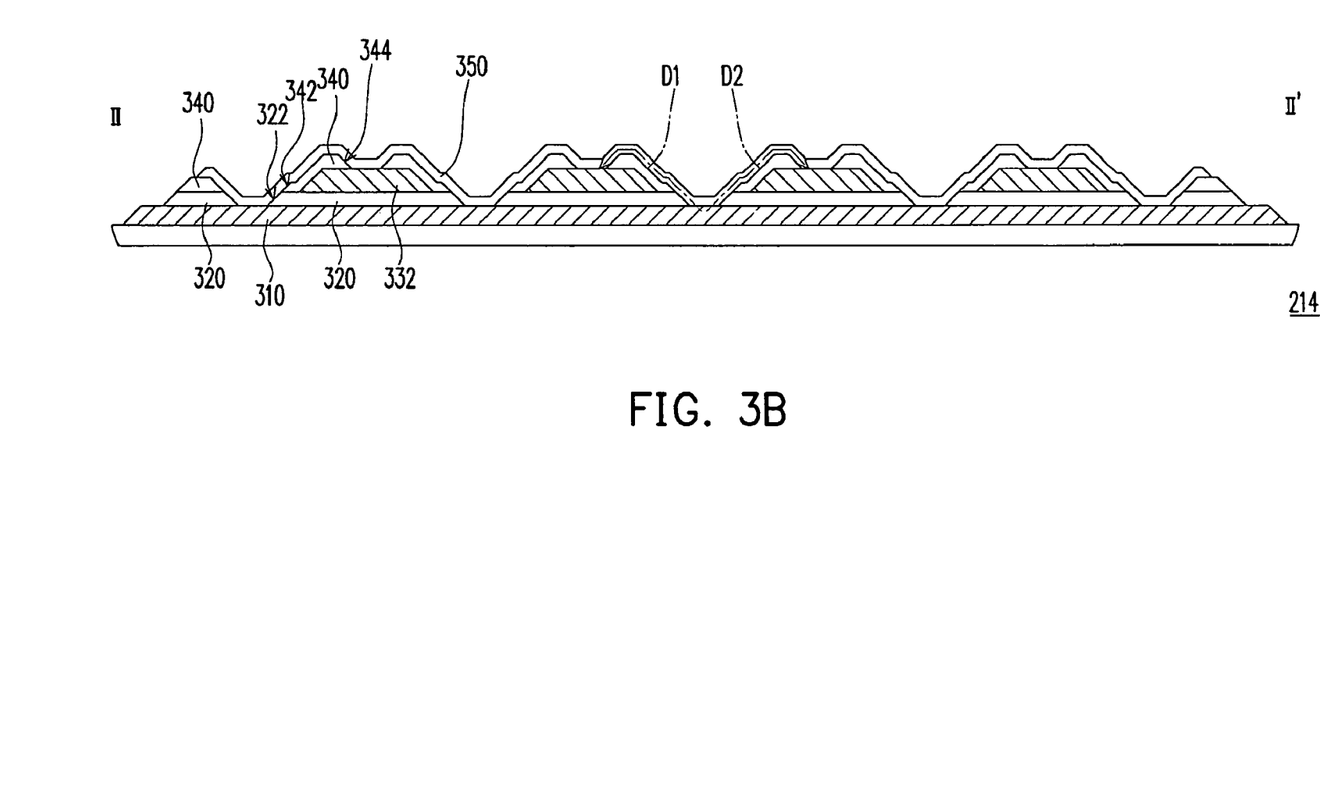
FIG. 3B is a cross-sectional view taken along a sectional line II-II' of FIG. 3A.

Besides, in order to further improve the signal transmission quality of the display panel 210 in the peripheral circuit region P according to a preferred embodiment of the present invention, the present invention further provides a chip bonding pad 214 elaborated hereinafter. FIG. 3A is a schematic partial enlarged view illustrating a location where chip bonding pads and a driving chip are disposed according to an embodiment of the present invention. FIG. 3B is a cross-sectional view taken along a sectional line II-II' of FIG. 3A. With reference to FIG. 3A, a rectangular region S is a region where the driving chips are located, and the chip bonding pad 214 is also disposed in the rectangular region S. Namely, the chip bonding pad 214 is substantially located below one of the first source driving chips 240 or the second source driving chips 250. The chip bonding pad 214 includes a first conductive layer 310, a first dielectric layer 320, a second conductive layer 330, a second dielectric layer 340, and a third conductive layer 350. Besides, the chip bonding pad 214 is disposed on a substrate (not marked).

As indicated in FIGS. 3A and 3B, the first dielectric layer 320 covers the first conductive layer 310 and has a plurality of first through holes 322. The second conductive layer 330 is disposed on the first dielectric layer 320. The second dielectric layer 340 covers the second conductive layer 330 and the first dielectric layer 320. In addition, the second dielectric layer 340 has a plurality of second through holes 342 and third through holes 344 arranged alternately. The second through holes 342 correspond to the first through holes 322, and accordingly the first through holes 322 and the third through holes 344 are arranged alternately as well. Preferably, the distances between each of the first through holes 322 and the two adjacent third through holes 344 are substantially the same, which is not limited in the present invention.

On the other hand, the third conductive layer 350 covers the second dielectric layer 340, the second conductive layer 330 exposed by the third through holes 344, and the first conductive layer 310 exposed by the first through holes 322. The first conductive layer 310 is electrically connected to the second conductive layer 330 through the third conductive layer 350. In a preferred embodiment, a material of the first conductive layer 310 and the second conductive layer 330 may include non-transparent metal including aluminum, neodymium, and molybdenum, or an alloy thereof, while a material of the third conductive layer 350 may include a transparent conductive material such as indium tin oxide or indium zinc oxide. Note that the materials of the first conductive layer 310, the second conductive layer 330, and the third conductive layer 350 are not limited in the present invention. For instance, when the display panel 210 depicted in FIG. 2A is the LCD panel, conductive material layers of the display panel 210 include a gate of an active device and a scan line formed by the first conductive layer, a source and a drain of the active device and a data line formed by the second conductive layer, and a pixel electrode formed by the third conductive layer. As such, the chip bonding pad 214 can be preferably formed by said conductive material layers, which is not limited in the present invention.

Referring to FIGS. 3A and 3B, in the present embodiment, the first through holes 322 and the third through holes 344 are alternately arranged along a predetermined direction. According to the present embodiment, the first through holes 322 and the third through holes 344 are alternately arranged along a direction of the sectional line II-II', for example. In other words, the first through holes 322 and the third through holes 344 are alternately arranged along a width direction of the wires 212. Preferably, the chip bonding pad 214 is directly connected to the wires 212 (the first wires 212A or the second wires 212B mentioned hereinbefore), which is not limited in the present invention. Besides, the second conductive layer 330 has a plurality of protrusions 332 that are partially exposed by the third through holes 344, and each of the first through holes 322 or each of the second through holes 342 is interposed between the two adjacent protrusions 332, respectively.

In the chip bonding pad 214 of the present embodiment, the exposed first conductive layer 310 and the exposed second conductive layer 330 are alternately arranged, preferably, and the distances between each of the first through holes 322 and the corresponding two adjacent third through holes 344 are substantially the same, which is not limited in the present invention. Therefore, when the signal of the first conductive layer 310 is transmitted to the second conductive layer 330, it is preferable that the signal can be transmitted along two paths simultaneously. For example, the signal can be transmitted along a direction D1 and a direction D2. Besides, the exposed first conductive layer 310 and the exposed second conductive layer 330 are connected in parallel through the third conductive layer 350, for example, which is not limited in the present invention.

Comparatively, in the chip bonding pad 150 depicted in FIG. 1B, the signal can only be transmitted along a single direction or path. Hence, according to the present embodiment, there exist different types of the signal transmission paths between the first conductive layer 310 and the second conductive layer 330. For example, the signal transmission of the present invention can be bidirectional. As such, the design of the chip bonding pad 214 in the present embodiment is conducive to increasing the number of the signal transmission paths between the first conductive layer 310 and the second conductive layer 330, leading to a reduction of the transmission impedance of the chip bonding pad 214.

In addition, it is known from FIG. 3A that the area occupied by the chip bonding pad 214 in the rectangular region S is affected by the distribution of the first through holes 322 and the third through holes 344. Specifically, in the present embodiment, the first through holes 322 and the third through holes 344 are alternately arranged along a predetermined direction instead of being juxtaposed in pairs. Thus, the chip bonding pad 214 of the present embodiment occupies a rather small area in the rectangular region S, and a relatively large area can be reserved in the middle of the rectangular region S, such that other circuit layouts can be selectively arranged in the middle of the rectangular region S. That is to say, the chip bonding pad 214 of the present embodiment not only can provide favorable signal transmission quality, but also can efficiently and economically determine areas respectively occupied by various elements in the rectangular region S. Thereby, the circuit layouts in the rectangular region S can be arranged in a more flexible manner.

Figure 4:
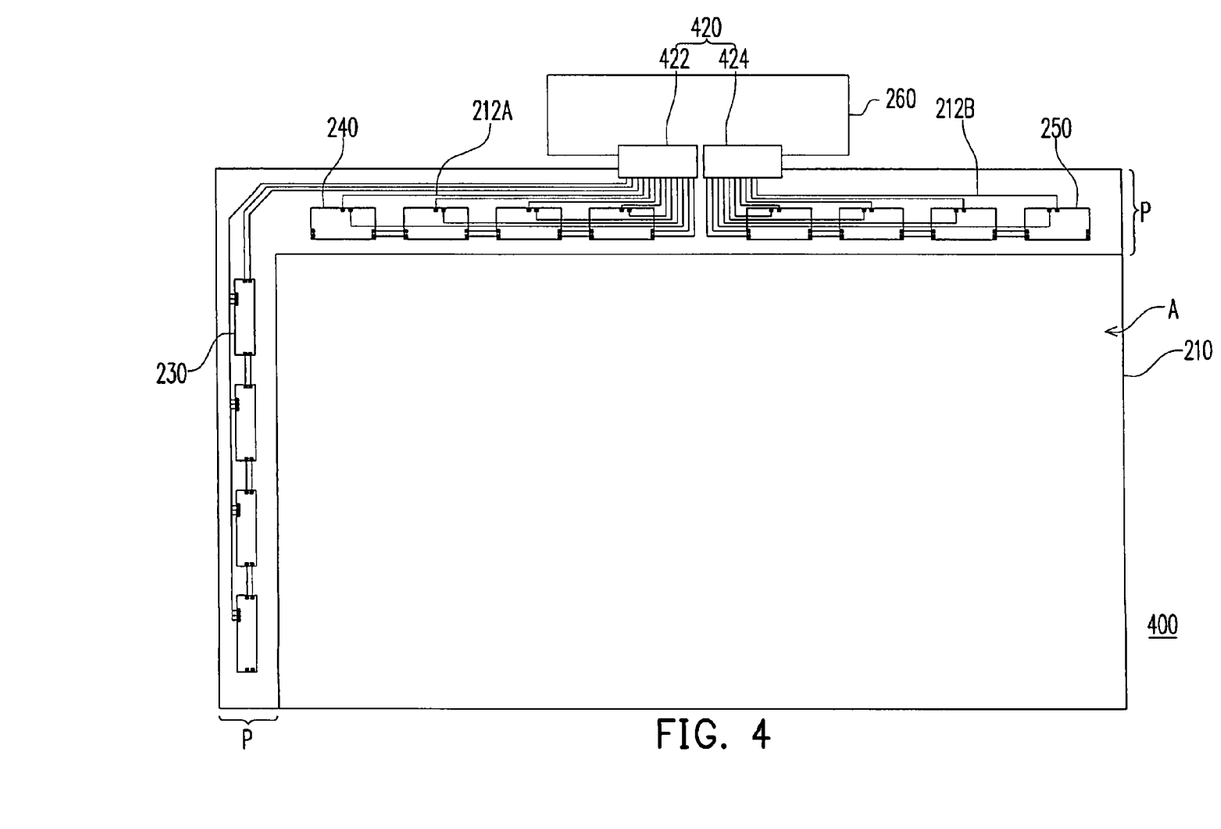
FIG. 4 illustrates a flat panel display according to another embodiment of the present invention.

FIG. 4 illustrates a flat panel display according to another embodiment of the present invention. Same reference numbers used in a flat panel display 400 depicted in FIG. 4 and in the flat panel display 200 illustrated in FIG. 2A represent same elements, and thus no further description is provided herein. Referring to FIG. 4, an FPC board 420 includes a first sub-FPC board 422 and a second sub-FPC board 424. The first sub-FPC board 422 is electrically connected to the first source driving chips 240 through the first wires 212A, while the second sub-FPC board 424 is electrically connected to the second source driving chips 250 through the second wires 212B.

To sum up, in the flat panel display of the present invention, the first wires and the second wires are concentrated or centralized in the peripheral circuit region, so as to reduce the required area occupied by the control circuit board. As a result, the flat panel display of the present invention is conducive to economizing the material use of the control circuit board. Meanwhile, some of the first wires and some of the second wires are designed as the circuitous traces according to the present invention and, therefore, the transmission impedance of each wire can be matched. Thereby, the flat panel display of the present invention is characterized by great signal transmission quality and outstanding display quality. Moreover, the chip bonding pad of the present invention not only provides more signal transmission paths but also occupies a rather small area. As such, the chip bonding pad disposed in the flat panel display also contributes to an improvement of the signal transmission quality of the flat panel display, and the circuit layout of the flat panel display can be arranged in a more flexible manner.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A flat panel display, comprising:
a display panel comprising a display region, a peripheral circuit region, and a plurality of first wires and second wires disposed within the peripheral circuit region;
a flexible printed circuit (FPC) board electrically connected to the first wires and the second wires, the first wires and the second wires respectively extending from the underneath of the FPC board to two opposite sides of the display panel;
a plurality of first source driving chips disposed in the peripheral circuit region and electrically connected to the FPC board through a part of the first wires, respectively;
a plurality of second source driving chips disposed in the peripheral circuit region and electrically connected to the FPC board through the second wires, respectively;
a control circuit board electrically connected to the FPC board; and
a chip bonding pad disposed under the first source driving chips or the second source driving chips, wherein the chip bonding pad comprises:
a first conductive layer;
a first dielectric layer covering the first conductive layer and having a plurality of first through holes;
a second conductive layer disposed on the first dielectric layer;
a second dielectric layer covering the second conductive layer and the first dielectric layer, and having a plurality of second through holes and third through holes arranged alternately, the second through holes corresponding to the first through holes; and
a third conductive layer covering the second dielectric layer, the second conductive layer exposed by the third through holes, and the first conductive layer exposed by the first through holes, wherein the first conductive layer is electrically connected to the second conductive layer through the third conductive layer.

2. The flat panel display as claimed in claim 1, further comprising a plurality of gate driving chips disposed in the peripheral circuit region and electrically connected to the other part of the first wires.

3. The flat panel display as claimed in claim 1, wherein the FPC board comprises:
a first sub-FPC board electrically connected to the first source driving chips through the part of the first wires; and
a second sub-FPC board electrically connected to the second source driving chips through the second wires.

4. The flat panel display as claimed in claim 1, wherein the number of the first source driving chips is equal to the number of the second source driving chips.

5. The flat panel display as claimed in claim 1, wherein at least one of the first wires or at least one of the second wires comprises a circuitous trace.

6. The flat panel display as claimed in claim 1, wherein at least two of the first wires or at least two of the second wires are electrically insulated from each other.

7. The flat panel display as claimed in claim 1, wherein the first wires or the second wires comprise power source signal transmission lines or ground signal transmission lines.

8. The flat panel display as claimed in claim 1, wherein the first wires or the second wires comprise multiple conductive lines.

9. The flat panel display as claimed in claim 1, wherein the distances between each of the first through holes and the two adjacent third through holes are substantially the same.

10. The flat panel display as claimed in claim 1, wherein the first through holes and the third through holes are alternately arranged along a width direction of the first wires or a width direction of the second wires.

11. The flat panel display as claimed in claim 1, wherein the second conductive layer has a plurality of protrusions partially exposed by the third through holes, and each of the second through holes is interposed between the two adjacent protrusions, respectively.

12. The flat panel display as claimed in claim 1, wherein the first conductive layer and the second conductive layer are substantially made of aluminum, neodymium, molybdenum, or an alloy thereof, and wherein the third conductive layer is substantially made of an indium tin oxide or indium zinc oxide.

13. The flat panel display as claimed in claim 1, further comprising a plurality of third wires and fourth wires disposed within the peripheral circuit region, wherein each of the third wires is electrically connected to the two adjacent first source driving chips, and each of the fourth wires is electrically connected to the two adjacent second source driving chips.

14. A chip bonding pad, comprising:
a first conductive layer;
a first dielectric layer covering the first conductive layer and having a plurality of first through holes;
a second conductive layer disposed on the first dielectric layer;
a second dielectric layer covering the second conductive layer and the first dielectric layer, and having a plurality of second through holes and third through holes arranged alternately, the second through holes corresponding to the first through holes; and
a third conductive layer covering the second dielectric layer, the second conductive layer exposed by the third through holes, and the first conductive layer exposed by the first through holes, wherein the first conductive layer is electrically connected to the second conductive layer through the third conductive layer.

15. The chip bonding pad as claimed in claim 14, wherein the distances between each of the first through holes and the two adjacent third through holes are substantially the same.

16. The chip bonding pad as claimed in claim 14, wherein the first through holes and the third through holes are alternately arranged along a predetermined direction.

17. The chip bonding pad as claimed in claim 14, wherein the second conductive layer has a plurality of protrusions partially exposed by the third through holes, and each of the second through holes is interposed between the two adjacent protrusions, respectively.

18. The chip bonding pad as claimed in claim 14, wherein the first conductive layer and the second conductive layer are substantially made of aluminum, neodymium, molybdenum, or an alloy thereof, and wherein the third conductive layer is substantially made of an indium tin oxide or indium zinc oxide.

* * * * *